United States Patent [19]

Nibby, Jr. et al.

[11] 4,302,735
[45] Nov. 24, 1981

[54] DELAY LINE COMPENSATION NETWORK

[75] Inventors: Chester M. Nibby, Jr., Peabody; Robert B. Johnson, Billerica, both of Mass.

[73] Assignee: Honeywell Information Systems Inc., Waltham, Mass.

[21] Appl. No.: 36,632

[22] Filed: May 7, 1979

[51] Int. Cl.³ .................... H03H 7/21; H03H 7/32
[52] U.S. Cl. ................... 333/138; 307/260; 333/23; 333/32
[58] Field of Search .............. 333/138–140, 333/166, 23, 32; 307/260, 262–268

[56] References Cited

U.S. PATENT DOCUMENTS 2,931,982  4/1960  Coeterier .................. 333/166 X
3,215,942 11/1965  La Rosa ..................... 333/138 X
3,660,786  5/1972  Senf ........................... 333/140

Primary Examiner—Marvin L. Nussbaum
Attorney, Agent, or Firm—Faith F. Driscoll; Nicholas Prasinos

[57] ABSTRACT

A timing generator circuit includes a pair of multitap cascaded delay lines of like construction. Each delay line includes a plurality of sections each of which are constructed to provide the same increment of delay at each tap. A capacitive element connects between predetermined taps of the two delay lines to form a compensation network including a predetermined section of each delay line. The compensation network which operates to cancel out the effects of any mismatch resulting from connecting the delay lines in series.

20 Claims, 8 Drawing Figures

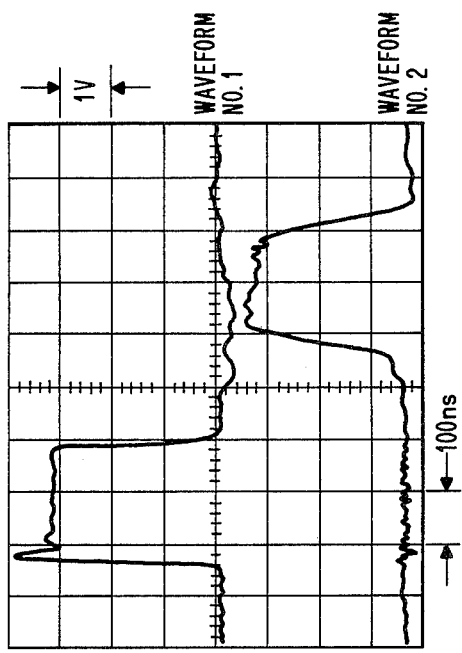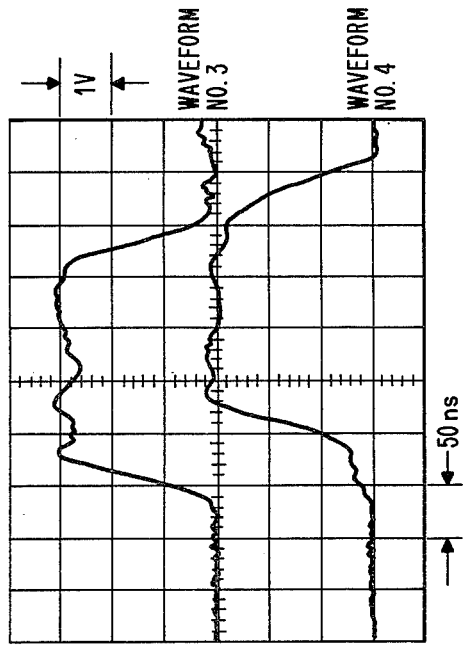
Fig. 5b.
Fig. 5a.

DELAY LINE COMPENSATION NETWORK

BACKGROUND OF THE INVENTION

Field of Use

This invention relates to timing circuits and, more particularly, to timing circuits constructed from delay lines.

Generally, in digital computer systems, the subsystems and/or digital logic circuits are interconnected through transmission line buses such as coaxial cable, microstrip transmission lines or the line. Each of the subsystems include separate timing circuits which establish the overall timing for the subsystem and are used to generate the necessary control signals for gaining access to the bus.

An example of such a subsystem is disclosed in the copending patent application entitled "A Dynamic Memory System which Includes Apparatus for Performing Refresh Operations in Parallel with Normal Memory Operations" bearing Ser. No. 926,480, filed on July 20, 1978 and now U.S. Pat. No. 4,185,323 and assigned to the same assignee as named herein. In order to provide the desired sequences of signals for operation of the memory subsystem, it is necessary to connect a pair of delay line circuits in series.

It has been found that while the delay lines are constructed to provide equal increments of delay and the same characteristic impedance, cascading or connecting them in series gives rise to a mismatch condition which tends to make the operation of the timing generator circuit less reliable. One approach is not to cascade the delay lines but to include additional driver buffer circuits to eliminate any mismatch. This results in added circuit complexity and cost in addition to altering the delay time of the lines.

Accordingly, it is a primary object of the present invention to provide an improved timing circuit.

It is a further object of the present invention to provide a delay line timing circuit which includes a minimum number of additional circuits for ensuring reliable operation.

SUMMARY OF THE INVENTION

The above objects are achieved in a preferred embodiment of a timing generator which is constructed in accordance with the teachings of the present invention. The timing generator includes a pair of multitap delay line circuits of like construction cascaded or connected in series. Each delay line circuit includes a number of like sections, each constructed to provide the same amount of delay at each tap and preserve the rise time characteristics of the pulse signals applied thereto.

The timing generator further includes a capacitive element connected between different predetermined taps of the delay lines to form a compensation network which includes a predetermined portion of each delay line. In the preferred embodiment, the capacitive element connects between the last tap of a first one of the delay lines and the first tap of the second one of the delay lines.

The network operates to apply a portion of the signal applied as an input to the second delay line of the correct polarity and phase (i.e., delay) to cancel with any reflected signal applied to the first delay line. By connecting the capacitive element between those taps of the delay lines which provide equal amounts of delay between the portion of the input signal and the reflected signal, the reflected signal produced by a mismatch in impedance between the two delay lines is cancelled completely. At the same time, the fast rise time characteristics of the signals provided by the particular construction of the delay lines which appear at all of the multitaps are preserved.

The novel features which are believed to be characteristic of the invention both as to its organization and method of operation, together with further objects and advantages will be better understood from the following description when considered in connection with the accompanying drawings. It is to be expressly understood, however, that each of the drawings are given for the purpose of illustration and description only and are not intended as a definition of the limits of the present invention.

BRIEF DESCRIPTION OF THE DRAWINGS

FIGS. 5a through 5c illustrate series of waveforms used in explaining the operation of the present invention.

DESCRIPTION OF THE PREFERRED EMBODIMENT

Figure 1:
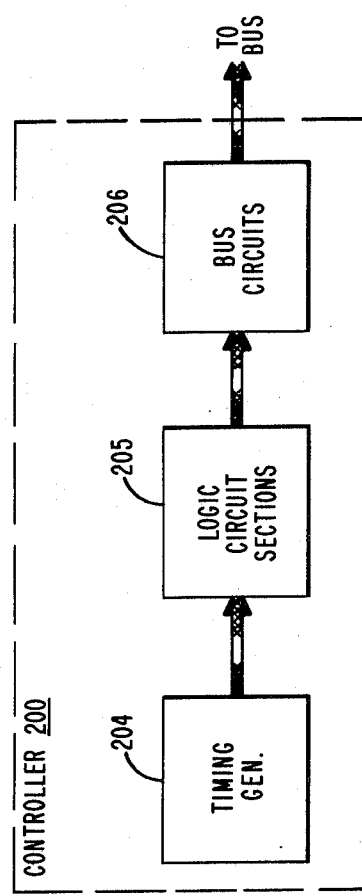
FIG. 1 is a block diagram of a portion of a subsystem including a timing generator which incorporates the compensating network of the present invention.

FIG. 1 shows in block diagram form a portion of a subsystem which corresponds to a memory controller 200. Briefly, the controller 200 includes a timing generator 204 shown in greater detail in FIG. 4. The timing generator 204 applies pulse signals to the various logic circuit sections of the controller represented by block 205. The pulse signals are thereafter applied through bus circuits to a bus of a data processing system, not shown.

It will be appreciated that any voltage spikes produced by the timing generator could produce error conditions in the data processing system may go completely undetected. This could arise because of the infrequency of occurrence of the error conditions or the particular conditions under which the error was detected causing the error to be attributed to some other problem. Accordingly, it is necessary that steps be taken to ensure that all output pulse signals which are generated for use within the controller have both the desired rise time characteristics and are free from any voltage variations which either closely approximates or exceeds the established thresholds of the logic circuits within the system.

Normally, the foregoing is achieved through the establishment of a given set of specifications for the delay lines used in the construction of the timing generator 204.

Figure 2A:
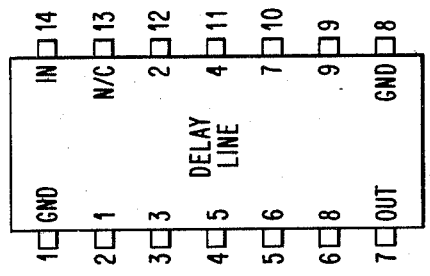
FIGS. 2a and 2b illustrate the type of delay line used in constructing the timing generator.
Figure 2B:
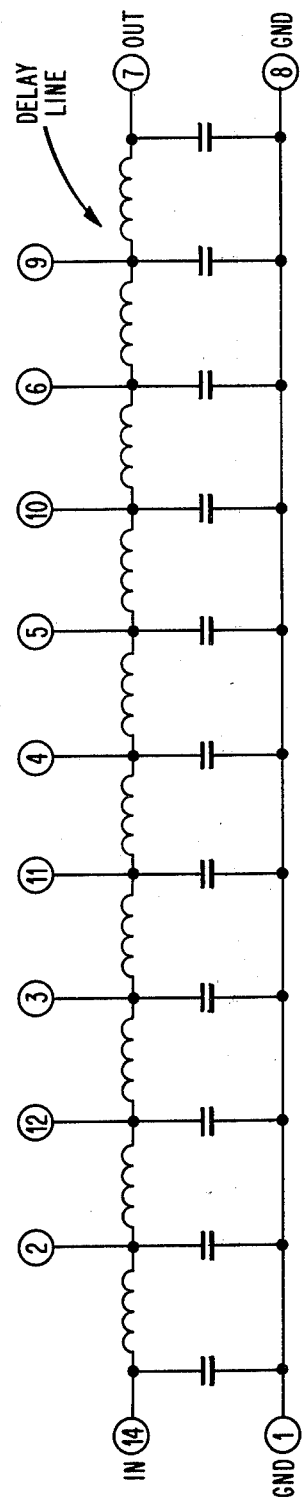

As seen from FIG. 2b, each multitap delay line is normally constructed to include a number of like inductor capacitor LC sections. The number of taps determines the number of sections. The sections are housed in a dual in line package as illustrated in FIG. 2a.

As seen from FIGS. 2a and 2b, each delay line includes ten sections wherein the different taps provide the following equal increments of delay:
Tap 1 = 20 nanoseconds ± 3 nanoseconds.
Tap 2 = 40 nanoseconds ± 3 nanoseconds.
Tap 3 = 60 nanoseconds ± 3 nanoseconds.
Tap 4 = 80 nanoseconds ± 4 nanoseconds.
Tap 5 = 100 nanoseconds ± 5 nanoseconds.
Tap 6 = 120 nanoseconds ± 6 nanoseconds.
Tap 7 = 140 nanoseconds ± 7 nanoseconds.
Tap 8 = 160 nanoseconds ± 8 nanoseconds.
Tap 9 = 180 nanoseconds ± 9 nanoseconds.
Tap out 200 nanoseconds ± 10 nanoseconds.

In addition to the above, the delay line has the following electrical requirements:
Input rise time = 10 nanoseconds ± 1 nanosecond.
Input fall time = 10 nanoseconds ± 1 nanosecond.
Pulse width = 600 nanoseconds ± 5 nanoseconds.
Pulse amplitude = 5 volts maximum.
Maximum pulse repitition rate = 1 megahertz.
Source impedance = 100 ohms ± 10%.
Output rise time = 40 nanoseconds maximum.
Output fall time = 40 nanoseconds maximum.
Total time delay = 200 nanoseconds ± 5%.
Tap to tap delay < 17 nanoseconds > 23 nanoseconds.
Characteristic impedance = 100 ohms ± 10%.
Pulse distortion: overshoot/undershoot ripple and internal mismatches and crosstalk = 10% maximum.

Figure 3:
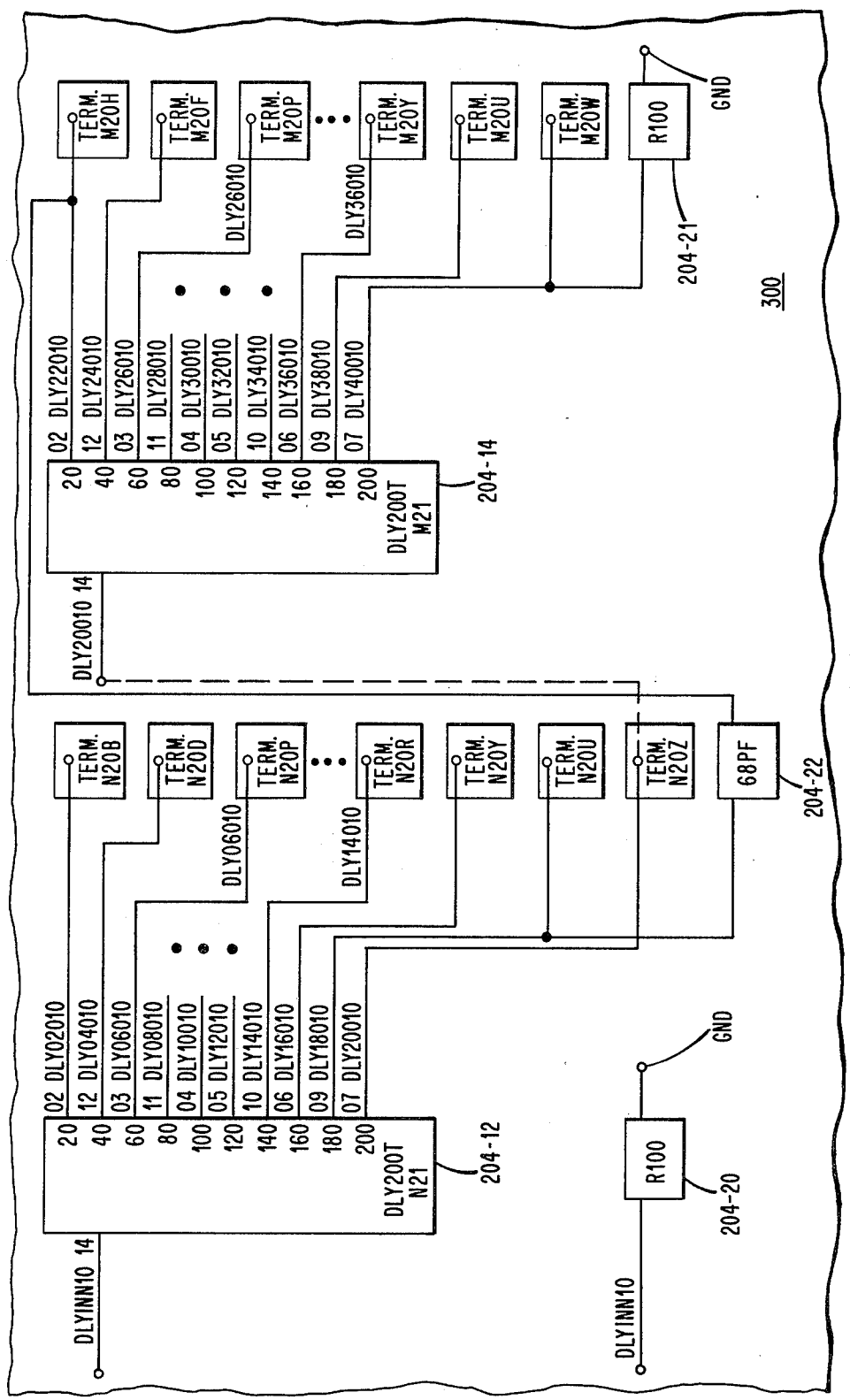
FIG. 3 illustrates the arrangement of delay line components for constructing the timing generator of FIG. 1.
Figure 4:
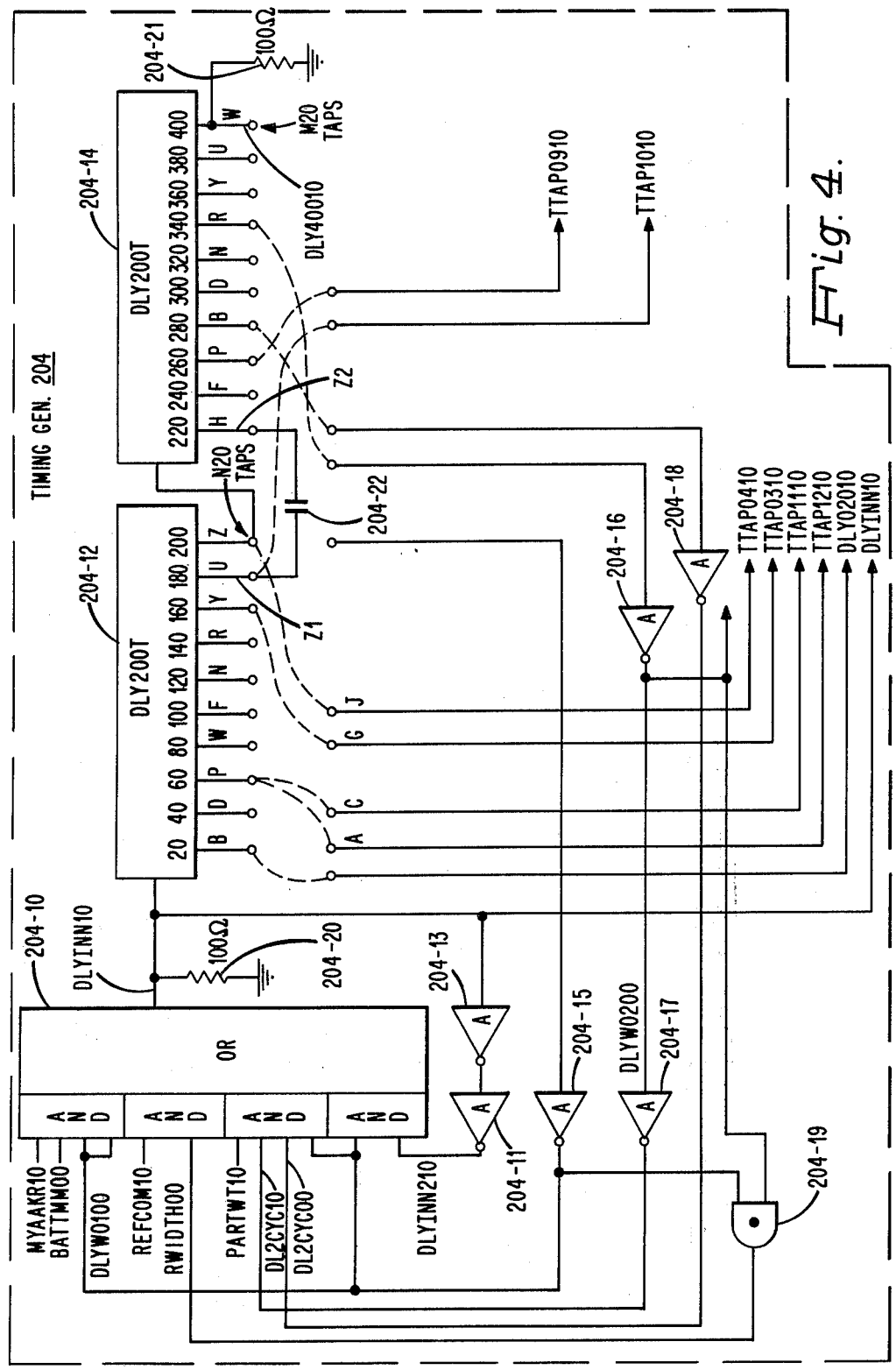
FIG. 4 shows schematically the timing generator of FIG. 1.

It has been noted that the input section of a delay line produces the greatest amount of degradation in the rise and fall times of the input pulse waveform. While the delay in each section is the same, it appears that certain changes are introduced into the construction of the input section in order to have the delay line meet the rise and fall time criteria as well as the pulse distortion criteria. However, the delay line meets the above requirements. To provide a large range of pulse signals, the timing generator 204 is constructed from two series connected cascaded delay lines as illustrated in FIGS. 3 and 4. The two delay lines are arranged on the controller circuit board 300 as shown in FIG. 3. The board is etched so that taps of the delay lines connect to the various terminal points. By external wiring (wire wrapping), the appropriate terminal can be connected to provide a particular function signal.

This can be better seen from FIG. 4. It is seen that the timing generator 204 includes the two pair of cascaded or series connected multitap 200 nanosecond delay lines 204-12 and 204-14. Both the input and output terminals of the lines 204-12 and 204-14 are terminated in their characteristic impedances through resistors 204-20 and 204-21. The four input AND/OR gate and driver circuit 204-10 is connected to apply a 220 nanosecond pulse signal to the input of delay line 204-12.

The input of delay line 204-12 is connected through a pair of series inverter circuits 204-13 and 204-11 back to one of the AND gates of ciruit 204-10. In accordance with the present invention. A capacitor 204-22 connects between tap U of line 204-12 and tap H of line 204-14.

The dotted lines in FIG. 4 indicate the connections between the variable taps N20 and M20 and a number of fixed function signals. As shown, some of the function signals are applied back to other ones of the AND gates via inverter circuits 204-15 through 204-18 and AND gate 204-19.

DESCRIPTION OF OPERATION

The timing generator 204 generates a series of timing pulses which establish the timing for the remaining sections of the memory controller 200 during a memory cycle of operation. The generator initiates a series of timing pulses in response to a signal MYACKR10 being switched to a binary ONE via the bus circuits of the system indicating the memory subsystem's acceptance of a bus cycle request or when a signal REFCOM10 is forced to a binary ONE indicating the start of a memory refresh cycle. This causes the four input AND/OR gate and driver circuit 204-10 to switch signal DLYINN10 from a binary ZERO to a binary ONE. This produces a positive going pulse signal across the 100 ohm termination resistor 204-20 which is propagated through the delay lines 204-12 and 204-14. The input signal DLYINN10 is applied via a pair of series connected inverter circuits 204-11 and 204-13 to back to the input of circuit 204-10 via another AND gate to latch or hold signal DLYINN10 in a binary ONE state. The circuit remains latched as long as signal DLYWO100 applied via an inverter circuit 204-15 remains a binary ONE.

After an interval of 200 nanoseconds, signal DLYWO100 switches to a binary ZERO causing signal DLYINN10 to be returned to a binary ZERO state. However, the positive going pulse signal continues propagation through delay line 204-14.

The tap terminals B through Z of both delay lines 204-12 and 204-14 provide fixed delays in increments of 20 nanoseconds. The pulse signals at these taps generated during a cycle of operation are distributed through jumpers to the various memory sections of the controller.

There are certain types of memory operations such as byte write and initialize operations which require additional sequences of timing pulses. In these types of memory operations, more than one pass or cycle through the delay lines 204-12 and 204-14 are completed. For example, in the case of byte write and initialize operations, a signal PARTWT10 is forced to a binary ONE. It remains a binary ONE until the end of the first pass or cycle at which time signals DL2CyC10 and DL2CYC00, applied via inverter circuits 204-17 and 204-18, respectively, condition the AND gate associated therewith to again switch signal DLYINN10 to a binary ONE. This causes another set of timing signals identical to the first set to be generated.

For a byte write operation, only two passes or cycles are required, the first cycle to perform a read operation and the second cycle to perform a write operation. In the case of an initialize operation, another or second cycle is required for writing binary ZEROS into each location of memory after each refresh cycle (i.e., signal REFCOM10 causes signal PARTSS00 to force signal PARTWT10 to a binary ONE).

Once the timing generator 204 begins a cycle of operation, they generate timing signals which cause row-/column address timing circuits of block 205 in FIG. 1 to produce two sets of clocking signals referred to as a normal set. These signals are generated by series connected inverter circuits and AND circuits which invert and combine timing signals TTAP1210, TTAP0410 and TTAP0310. The two sets of clocking signals are applied to a steering network also included within block 205.

During normal operation, the compensating network of the present invention operates to eliminate any voltage spikes produced by cascading the two delay lines 204-12 and 204-14. That is, as mentioned above, any differences in the impedance characteristics of the first section of delay line 204-14 as compared with the last section of delay line 204-12 cause a mismatch which produces voltage reflections. It is well known that the coefficient of reflection K may be expressed as $K=(Z-Zo)/(Z+Zo)$ wherein $Z=$ the terminating impedance and $Zo=$ characteristic impedance of the line.

From this equation, it is seen that:

a. No voltage reflections occur when $Z=Zo$, that is, when the impedances of the two sections are matched (i.e., $K=0$);

b. Positive voltage reflections occur when Z is greater than Zo, when the last section is over terminated (i.e., $K>0$);

c. Negative voltage reflections occur when Z is less than Zo, that is, when the last section is under terminated (i.e., $K<0$);

d. Total negative voltage reflections occur when $Z=0$. That is, when the last section is terminated in a short circuit (i.e., $K=-1$); and, e. Total positive voltage reflections occur when $Z=\alpha$, that is, when the last section is terminated in an open circuit (i.e., $K=1$).

Positive reflections mean that the polarity of the reflected voltage waveform is the same as the polarity of the incident voltage waveform, conversely, negative voltage reflections mean that the polarity of the reflected voltage waveform is opposite that of the incident voltage waveform.

In order to provide the requisite rise and fall times in addition to preventing overshoot or undershoot, the first section of the delay line has an impedance which is less than the characteristic impedance. This can result in negative voltage reflections being propagated back from line 204-14 towards the driving source of line 204-12. These reflections correspond to a small portion of the incident pulse waveform which continues to propagate without reflection through delay line 204-14 which is terminated in the characteristic impedance via resistor 204-21. However, capacitor 204-22 which has a small value of capacitance acts to cancel the negative voltage reflections from tap Z back to tap U. Either side of the capacitor 204-22 is connected at a tap to provide identical amounts of delay of 20 nanoseconds. The result is that the positive edge of the incident pulse waveform arrives at the H tap of line 204-14 at the same time that the negative reflected voltage appears at tap U of line 204-12. This causes the capacitor 204-22 to cancel out the negative going spike with the small positive voltage obtained from the incident pulse waveform.

Cancellation of voltage spikes occurs on both the leading and trailing edges of the incident pulse waveform without affecting the time delay of the sections.

Figure 5C:
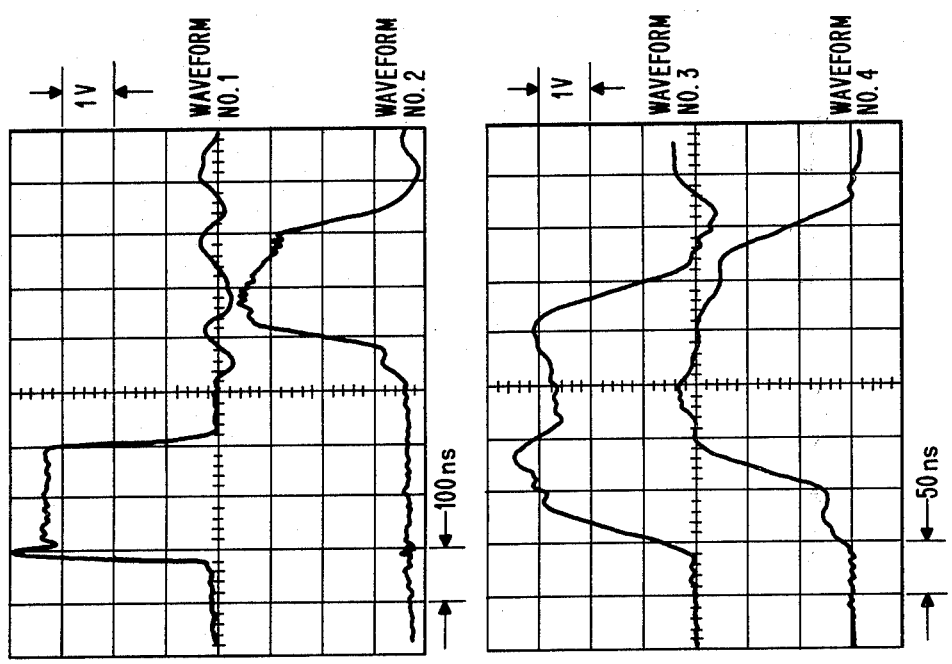

The manner in which the compensating network operates to eliminate the voltage spikes will be better understood with reference to FIGS. 5a through 5c. FIG. 5a illustrates the waveforms at various points along the two connected delay lines 204-12 and 204-14 which do not include the compensating network of the present invention. The first waveform corresponds to signal DLYINN10 at the input to delay line 204-12. As seen from the waveform, there is a negative going voltage spike followed by a positive going spike. The spikes are produced at the point where the two delay lines are connected in series. However, it will be noted from the second waveform that there are no voltage spikes at the various taps along delay line 204-14. The second waveform corresponds to signal DLY40010 in FIG. 4.

The amplitudes of the voltage spikes are such that they can combine with the input or incident waveform to produce resultant waveforms at the delay line taps which will be detected as having occurred earlier or later in time than they actually did. The result is that the timing generator output timing signals could give rise to timing errors in certain situations.

This is seen from the next waveform which corresponds to the pulse signal appearing at tap U. As shown, the negative and positive voltage spikes subtract and add to the incident input waveform producing the negative undershoot characteristic on the top of the incident pulse and the positive overshoot characteristic at the trailing edge of the incident pulse. It is seen that the amplitude of each reflected voltage spike approximates a volt and therefore can override or "trip" the voltage thresholds of the logic circuits within the system such as to be detected as part of the actual timing pulse.

The fourth waveform corresponds to the pulse signal appearing at tap H. This waveform shows that the pulse signal at the various taps of the delay line 204-14 is unaffected by the voltage spikes.

The series waveforms of FIG. 5b illustrate the same points along the two delay lines 204-12 and 204-14 when connected to include the compensating network of the present invention. In this case, the network includes a capacitor selected to have a value of 68 picofarads. It is seen from the first waveform that the compensating network has reduced markedly the amplitude of the voltage spikes to value which will not trip the thresholds of the system logic circuits. This can be better seen from the third waveform at tap U.

It will be noted that the amplitude of both voltage spikes have been reduced to almost one-third of the original value. The fourth waveform at tap H shows that there are substantially no undesirable effects caused by the compensating network. The only noticeable effect is the slight rise in voltage at the leading edge of the pulse signal. However, since the amplitude is small, there is no problem as concerns tripping the thresholds of the system logic circuits.

The last series of waveforms of FIG. 5c also illustrate the above same points when the delay lines are connected to include the compensating network of the present invention. However, the network includes a capacitor selected to have a value of 150 picofarads. It will be noted that in this case, the network is still effective to reduce the amplitude of voltage spikes. However, it is seen from the fourth waveform at tap H that the amplitude of the voltage appearing at the leading edge of the incident waveform is increased. If increased too much, the voltage could be detected as the start of the pulse. Thus, a value of capacitance should be selected for the network which produces a voltage whose amplitude is sufficient to cancel the voltage spikes caused by reflection. As the capacitance value is increased, the amplitude of the voltage furnished by the network increases as illustrated in FIG. 5c. However, if the capacitance value is too large, there is a chance that the voltage furnished by the network which is applied to the second delay line may be large enough in amplitude to be detected as the leading edge of the pulse signal.

The above discussion has illustrated the results obtained by the compensating network of the present invention formed as part of the two delay lines 204-12 and 204-14. However, it is believed desirable to discuss further the operation of arrangement and how the network achieves the cancellation of the voltage spikes. As mentioned previously, the input section of each delay line was modified in order to meet certain delay tolerances and overshoot characteristics specified herein.

It was found that it was necessary to add capacitance to the input section. The effect was to lower the input impedance of the first input section. Referring to FIG. 4, it is seen that the impedances at the left and right sides of capacitor 204-22 are labeled Z1 and Z2 respectively. The impedance Z1, looking into the last tap U of delay line 204-12, is greater in magnitude than the impedance Z2 looking into the first tap H of delay line 204-14.

Thus, the equivalent circuit at the last tap of delay line 204-12 including the compensating network can be viewed as comprising the capacitor 204-22 in series with a resistor having the impedance value Z2. Similarly, the equivalent circuit at the first tap of delay line 204-14 including the compensating network can be viewed as comprising the capacitor 204-Z2 in series with a resistor having the impedance value Z1.

The first time constant at the tap U (T=180 ns) of delay line 204-12 of the circuit including the capacitor 204-22 and impedance value Z2 is less or shorter than the time constant at tap H of delay line 204-14 of the circuit including capacitor 204-22 and impedance value Z1. This causes the compensating network to furnish a larger amplitude voltage signal at tap U in response to the incident waveform at tap H than the voltage signal applied to tap H in response to the incident waveform at tap U. Accordingly, the compensating network operates to cancel the positive and negative voltage spikes without adversely affecting the characteristics of the timing pulse signals.

It will be appreciated that the positive voltage spike is generated by the network each time the leading edge of the incident waveform is applied thereto. This can be seen when the leading edge of the incident waveform is viewed in terms of two components. One component is a positive ramp of voltage beginning at a time which corresponds to the start of the waveform (i.e., time 0) and the other is a negative ramp of voltage which begins at approximately 20–25 nanoseconds later such that the sum of both ramps approximates the original waveform leading edge.

By means of superposition, it is seen that the compensating network provides an exponential response for each component, an exponential rise up to the end of the rise time followed by an exponential decay. At the first point where the leading edge of the incident waveform is applied to one end of the compensating network, a first fairly small positive going voltage is generated because of the smaller time constant. This produces the slight increase in voltage at the leading edge of thhe fourth waveform of FIG. 5b. At the next point where the leading edge of incident waveform is applied to the other end of the compensating network, a second larger positive going voltage is generated because of the larger time constant. This voltage is large enough to effectively cancel with the negative reflected voltage produced by connecting delay lines 204-12 and 204-14 in series.

Of course, it will be appreciated that the increase in the value of capacitance of capacitor 204-22, in turn, increases the amount of positive voltage generated in response to the leading edges of the incident waveform. This produces the results discussed in connection with FIG. 5c.

In the preferred embodiment, the capacitor 204-22 was selected to a value of 68 picofarads. It will be obvious that other values could also be used without departing from the teachings of the present invention.

It is seen that by constructing a compensating network utilizing certain elements within the delay lines to be cascaded provides a low cost reliable way of constructing a timing generator.

In practice, the invention can be used with changes from the illustrated embodiment and, for example, can be used in the construction of other types of timing generators which utilize cascaded delay lines. Also, other types of driver circuits and other types of delay lines having different characteristic impedance may also be used.

It will be appreciated by those skilled in the art that many changes may be made to the illustrated embodiment in addition to those mentioned above.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. A timing generator circuit for generating a sequence of output timing pulses in response to input timing pulses, said circuit comprising:
   a first multisection delay line having an input terminal for receiving said input timing pulses, a plurality of taps and an output tap;
   a second multisection delay line having an input terminal directly coupled to said output tap of said first delay line and a plurality of taps and an output tap; and,
   capacitive means having first and second terminals for connecting said capacitive means between predetermined taps connected to last and first sections of said first and second multisection delay lines forming a compensating network with the corresponding sections of said delay lines for cancelling voltage reflections produced by connecting said first and second delay lines in series.

2. The generator circuit of claim 1 wherein said capacitive means is a capacitor.

3. The generator circuit of claim 1 wherein each of said first and second delay lines are constructed to provide the same predetermined increment of delay between successive ones of said plurality of taps and wherein said predetermined taps of said first and second delay lines correspond to a last one of said plurality of taps connected at the input of said last section and a first one of said plurality of said taps respectively connected at the output of said first section for enabling said capacitive means to apply voltage signals of the correct polarity and phase for cancelling said voltage reflections.

4. The generator circuit of claim 3 wherein each of said first and second delay lines have a plurality of inductor-capacitor sections constructed to provide the same predetermined electrical and delay characteristics for each of said plurality of sections for generating said sequence of output timing pulses with a minimum of distortion.

5. The generator circuit according to claim 4 wherein each of said inductor-capacitor sections has an input and an output, said last section of said first delay line has an input impedance Z1 which is greater in magnitude than an input impedance Z2 of said first section of said second delay line producing voltage reflections in response to the application of said input timing pulses to said input terminal of said second delay line.

6. The timing generator of claim 5 wherein said capacitive means is selected to have a value of capacitance wherein a first time constant of said compensating network formed by said capacitive means and impedance Z2 is less in magnitude than a second time constant of said compensating network formed by said capacitive means and said impedance Z1 for cancelling said voltage reflections without adversely affecting the characteristics of said output timing pulses.

7. The timing generator of claim 6 wherein said value of capacitance is 68 picofarads.

8. A timing generator circuit for generating a sequence of output timing pulses in response to input timing pulses, said circuit comprising:
a first delay line having a plurality of like constructed sections, an input terminal for receiving said input timing pulses, a plurality of taps and an output tap;
a second delay line having a plurality of said like constructed sections, an input terminal directly coupled to said first delay line output tap, a plurality of taps and an output tap;
capacitive means having first and second terminals for connecting said capacitive means between predetermined taps connected to last and first sections of said first and second delay lines forming a compensating network with said last and first sections of said delay lines, said network being operative in response to said input timing pulses to apply voltage signals of sufficient amplitude, correct phase and polarity to cancel with voltage spikes generated by connecting said first and second delay lines in series.

9. The generator circuit of claim 8 wherein said capacitive means is a capacitor.

10. The generator circuit of claim 8 wherein each of said first and second delay lines are constructed to provide the same predetermined increment of delay between successive ones of said plurality of taps and wherein said predetermined taps of said first and second delay lines correspond to a last one of said plurality of taps connected at the input of said last section and a first one of said plurality of said taps connected at the output of said first section.

11. The generator circuit of claim 10 wherein each of said first and second delay lines have a plurality of inductor-capacitor sections constructed to provide the same predetermined electrical and delay characteristics for each of said plurality of sections for generating said sequence of output timing pulses with a minimum of distortion.

12. The generator circuit according to claim 11 wherein each of said inductor-capacitor sections has an input and an output, said last section of said first delay line has an input impedance Z1 which is greater in magnitude than an input impedance Z2 of said first section of said second delay line producing negative voltage reflections in response to the application of said input timing pulses to said input terminal of said second delay line.

13. The timing generator of claim 12 wherein said capacitive means is selected to have a value of capacitance wherein a first time constant of said compensating network formed by said capacitive means and impedance Z2 is less in magnitude than a second time constant of said compensating network formed by said capacitive means and said impedance Z1 for cancelling said voltage reflections without adversely affecting the characteristics of said output timing pulses.

14. The timing generator of claim 13 wherein said value of capacitance is 68 picofarads.

15. A timing generator circuit for generating a sequence of output timing pulses in response to input timing pulses, said circuit comprising:
first and second delay lines having a number of sections, and input terminal and a corresponding number of taps and an output tap, said first delay line input terminal being connected to receive said input timing pulses and said first delay line output tap being directly connected to said second delay line input terminal; and,
a compensating network comprising:
a last one of said number of sections of said first delay line;
a first one of said number of sections of said second delay line; and,
capacitive means having first and second terminals, said first terminal and second terminals being connected between said first one of said sections of said second delay line and said last one of said sections of said first delay line respectively, said compensating network being operative in response to said input timing pulses to apply voltage signals of predetermined polarities and phase for cancelling voltage reflections produced by connecting said first and second delay lines in series.

16. The generator circuit of claim 15 wherein said capacitive means is a capacitor.

17. The generator circuit of claim 16 wherein each of said number of sections of said first and second delay lines are constructed from inductor-capacitor elements to provide the same predetermined electrical and delay characteristics for generating said sequence of output timing pulses with a minimum of distortion.

18. The generator circuit according to claim 17 wherein each of said inductor-capacitor sections has an input and an output, said last one of said sections of said first delay line has an input impedance Z1 which is greater in magnitude than an input impedance Z2 of said first one of said sections of said second delay line producing negative voltage reflections in response to the application of said input timing pulses to said input terminal of said second delay line.

19. The timing generator of claim 18 wherein said capacitive means is selected to have a value of capacitance wherein a first time constant of said compensating network corresponding to said capacitive means and impedance Z2 is less in magnitude than a second time constant of said compensating network corresponding to said capacitive means and said impedance Z1 for cancelling said voltage reflections without adversely affecting the characteristics of said output timing pulses.

20. The timing generator of claim 19 wherein said value of capacitance is 68 picofarads.

* * * * *